United States Patent [19]
Kindler et al.

[11] Patent Number: 6,136,463
[45] Date of Patent: Oct. 24, 2000

[54] HSPES MEMBRANE ELECTRODE ASSEMBLY

[75] Inventors: Andrew Kindler, San Marino; Shiao-Ping Yen, Altadena, both of Calif.

[73] Assignee: California Institute of Technology, Pasadena, Calif.

[21] Appl. No.: 09/199,074

[22] Filed: Nov. 23, 1998

Related U.S. Application Data

[60] Provisional application No. 60/066,849, Nov. 25, 1997.

[51] Int. Cl.$^7$ ...................................................... H01M 4/86
[52] U.S. Cl. .................. 429/40; 429/45; 429/44; 429/30
[58] Field of Search .................. 429/30, 40, 44, 429/45

[56] References Cited

U.S. PATENT DOCUMENTS

| | | | |
|---|---|---|---|
| 5,561,000 | 10/1996 | Dirven et al. | 429/42 |
| 5,599,638 | 2/1997 | Surampudi et al. | 429/33 |
| 5,773,162 | 6/1998 | Surampudi et al. | 429/39 |
| 5,795,496 | 8/1998 | Yen et al. | 252/62.2 |

*Primary Examiner*—Maria Nuzzolillo
*Assistant Examiner*—Angela J. Martin
*Attorney, Agent, or Firm*—Fish & Richardson P.C.

[57] ABSTRACT

An improved fuel cell electrode, as well as fuel cells and membrane electrode assemblies that include such an electrode, in which the electrode includes a backing layer having a sintered layer thereon, and a non-sintered free-catalyst layer. The invention also features a method of forming the electrode by sintering a backing material with a catalyst material and then applying a free-catalyst layer.

20 Claims, 3 Drawing Sheets

CATHODE

HSPES MEMBRANE ELECTRODE ASSEMBLY

CROSS REFERENCE TO RELATED APPLICATIONS

This application claims the benefit of the U.S. Provisional Application No. 60/066,849, filed on Nov. 25, 1997, which is incorporated herein by reference.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND OF THE INVENTION

Many electrochemical oxidation reduction-driven applications require proton conductive materials. One specific fuel cell of this type is described in our U.S. Pat. No. 5,599,638, based on Ser. No. 08/135,007, the disclosure of which is incorporated herein. That patent describes a breakthrough in aqueous methanol-based fuel cells.

This special aqueous-methanol fuel cell is the first practical fuel cell to operate without an acid electrolyte. Like many other fuel cells, however, this fuel cell requires a proton conducting membrane and effective electrode assemblies. At the time of the writing of this application, the electrodes of the fuel cell have demonstrated problems associated with catalyst utilization. The electrodes are critical for optimal performance of the fuel cell. An electrode that lacks proper catalyst utilization renders some of the catalyst unable to participate in the electrochemical reaction. Thus, reducing the reaction's efficiency.

It is an object of the present invention to define new electrodes for use in such fuel cells. These materials improve overall fuel cell function by affecting catalyst loading and utilization at the electrodes.

It is a further object of the invention to provide methods of forming these new electrodes.

SUMMARY OF THE INVENTION

The present invention provides an electrode having a free-catalyst layer. The cathode comprises a backing with a sintered catalyst and a free catalyst layer. The electrode may further include an effective waterproofing amount of Teflon in the sintered layer.

The invention also provides methods for forming an electrode having improved catalyst utilization comprising sintering a catalyst material to a backing material and layering a free-catalyst layer on the sintered layer. The combination is then heat pressed to the proton conducting membrane. The sintered catalyst material may additionally include a waterproofing amount of Teflon.

BRIEF DESCRIPTION OF THE DRAWING

These and other objects of the present invention will now be described in detail with reference to the accompanying drawing, in which.

DESCRIPTION OF THE PREFERRED EMBODIMENTS

Techniques for forming the cathode electrode are described herein. These techniques optimize the operation of the cathode for use with non-pressurized air. Formation techniques for the cathode are also described herein.

Figure 1:
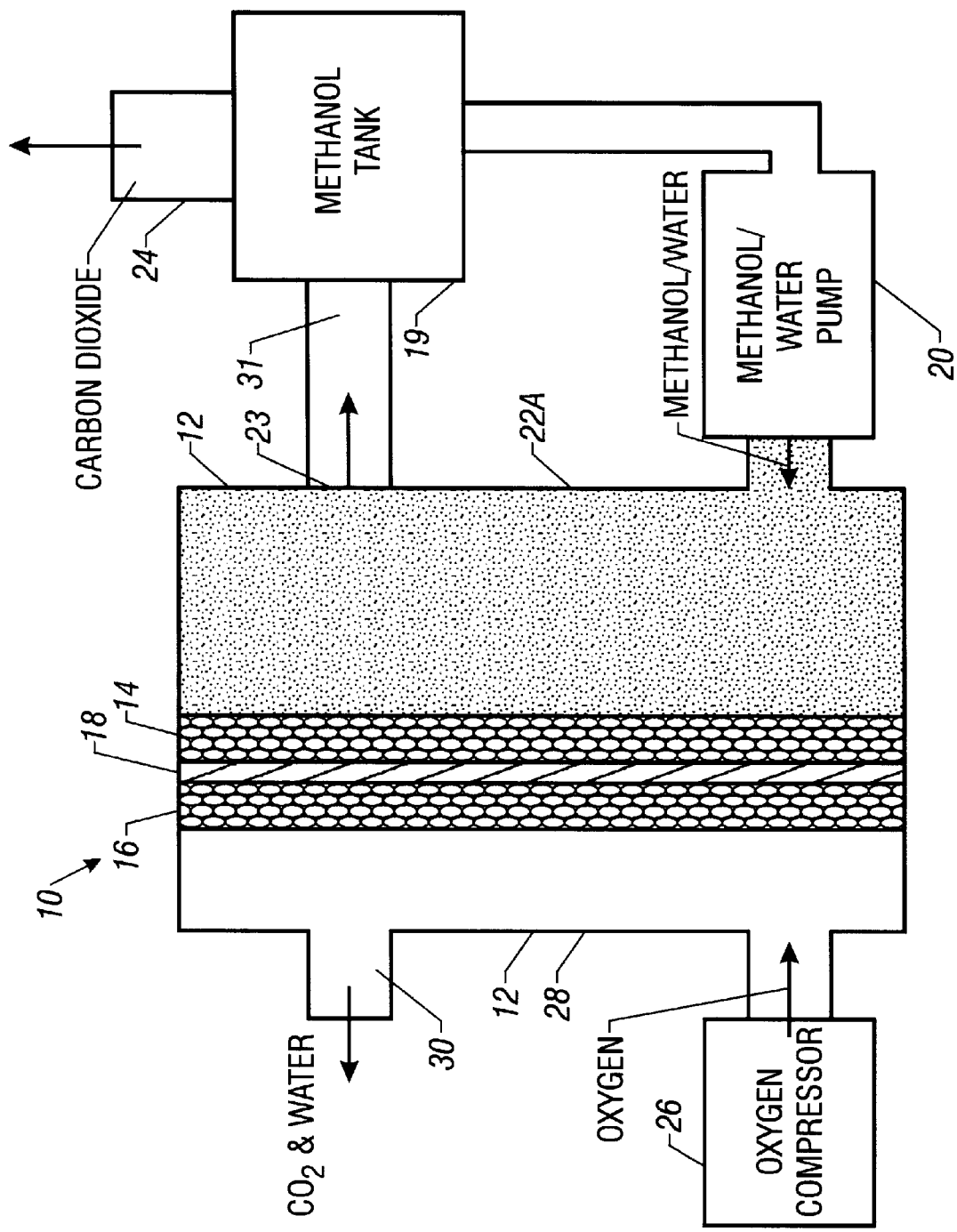
FIG. 1 shows a preferred fuel cell of the present invention.

FIG. 1 illustrates a liquid feed organic fuel cell 10 having a housing 12, an anode 14, a cathode 16 and a solid polymer proton-conducting cation-exchange electrolyte membrane 18. As will be described in more detail below, anode 14, cathode 16 and solid polymer electrolyte membrane 18 are preferably a single multi-layer composite structure, referred to herein as a membrane-electrode assembly or MEA. A pump 20 is provided for pumping an organic fuel and water solution into an anode chamber 22 of housing 12. The organic fuel and water mixture is withdrawn through an outlet port 23 and is re-circulated through a re-circulation system which includes a methanol tank 19. Carbon dioxide formed in the anode compartment is vented through a port 24 within tank 19. An oxygen or air compressor 26 is provided to feed oxygen or air into a cathode chamber 28 within housing 12. The following detailed description of the fuel cell of FIG. 1 primarily focuses on the structure and function of anode 14, cathode 16 and membrane 18.

Prior to use, anode chamber 22 is filled with the organic fuel and water mixture and cathode chamber 28 is filled with air or oxygen. During operation, the organic fuel is circulated past anode 14 while oxygen or air is pumped into chamber 28 and circulated past cathode 16. When an electrical load (not shown) is connected between anode 14 and cathode 16, electro-oxidation of the organic fuel occurs at anode 14 and electro-reduction of oxygen occurs at cathode 16. The occurrence of different reactions at the anode and cathode gives rise to a voltage difference between the two electrodes. Electrons generated by electro-oxidation at anode 14 are conducted through the external load (not shown) and are ultimately captured at cathode 16. Hydrogen ions or protons generated at anode 14 are transported directly across membrane electrolyte 18 to cathode 16. Thus, a flow of current is sustained by a flow of ions through the cell and electrons through the external load.

The fuel cell described herein comprises an anode, cathode, and a membrane, all of which form a single composite layered structure. The membrane may be of any material so long as it has the ability to separate the solvents of the fuel cell and retains proton conducting capability. One such membrane, for example is Nafion, a perfluorinated proton-exchange membrane material. Nafion is a co-polymer of tetrafluroethylene and perflurovinylether sulfonic acid. Other membrane material can also be used as described in U.S. Pat. No. 5,795,596, based upon Ser. No. 08/561,899, the disclosure of which is incorporated herein. Additionally, membranes of modified perfluorinated sulfonic acid polymer, polyhydrocarbon sulfonic acid and composites of two or more kinds of proton exchange membranes can be used.

The anode is formed from platinum-ruthenium alloy particles either as fine metal powders, i.e., "unsupported", or dispersed on high surface area carbon, i.e., "supported". The high surface area carbon may be material such as Vulcan XC-72A, provided by Cabot Inc., USA. A carbon fiber sheet backing may be used to make electrical contact with the particles of the electrocatalyst, however those of skill in the art will recognize additional materials suitable for this purpose. For example, commercially available Toray paper is used as the electrode backing sheet. A supported alloy electrocatalyst on a Toray paper backing is available from E-Tek, Inc., of Framingham, Mass. Alternatively, both unsupported and supported electrocatalysts may be prepared by chemical methods, combined with Teflon binder and spread on Toray paper backing to produce the anode.

The cathode is a gas diffusion electrode in which platinum particles have traditionally been bonded to one side of the membrane. The cathode has traditionally been formed from unsupported or supported platinum bonded to a side of membrane opposite to the anode. Previous cathode preparations typically resulted in loss of catalyst and thus reduced electrochemical efficiency. An efficient and time-saving preferred method of fabrication of electrocatalytic electrodes is describe in detail below. This new cathode and process of formation results in a cathode having improved electrochemical efficiency and improved catalyst utilization.

Figure 2A:
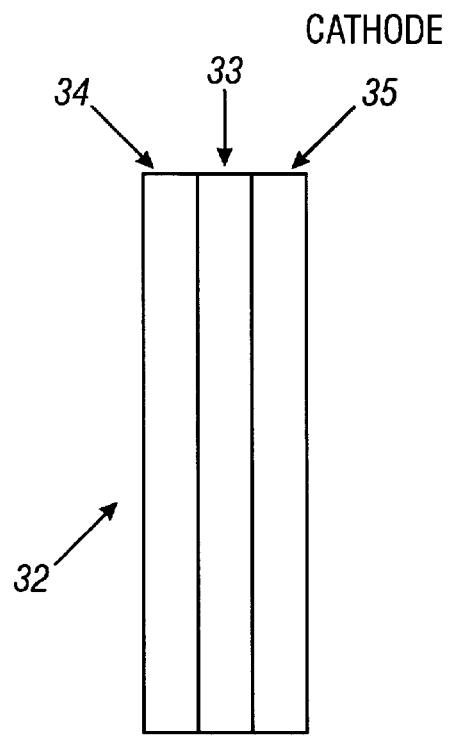
FIG. 2 shows A) the structure of prior cathodes, and B) the preferred electrodes of the present invention.
Figure 2B:
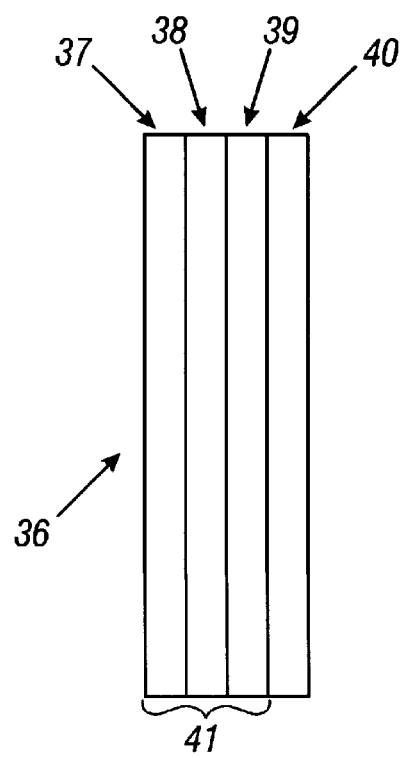

FIG. 2A shows a prior art cathode 32. This has a single catalyst layer 33, painted on a support backing 34. The catalyst layer includes TEFLON, water, triton and catalyst. This painted-catalyst layer 33 is sintered to the support backing 34 to immobilize the catalyst. A third Nafion layer 35 is then applied to the sintered-catalyst covered electrode before hot pressing. This approach results in a cathode having three layers, i.e. a backing layer 34, a sintered layer 33, and a Nafion layer 35.

The preferred cathode of the present embodiment comprises a number of new features. The present cathode has improved bonding and reduced migration of the catalyst. The approach provided by the present embodiment is believed to result in improved catalytic function at the cathode. An electrode 36 is provided having a free-catalyst layer 39. The electrode comprises a backing 37 with a sintered catalyst 38 and a free catalyst layer 39. The electrode may further include an effective waterproofing amount of Teflon in the sintered layer.

The electrode is formed as follows. First, a catalyst material 38 is sintered to a backing material 37, a free-catalyst layer 39 is layered on the sintered layer. As used herein, "sintering" refers to the process of heating without melting. The combination is then heat pressed to the proton conducting membrane. The sintered catalyst material may additionally include a waterproofing amount of Teflon. Any catalyst suitable for undergoing oxidation-reduction is suitable for the present invention. Platinum is preferred. Unsupported platinum black (fuel cell grade) available from Johnson Matthey, Inc, USA or supported platinum materials available from E-Tek, Inc, USA are suitable for the cathode. Catalyst loading remains in the same amount, however it is divided between a sintered 38 and non-sintered layer 39.

For example, half the catalyst (2 mg/cm$^2$) was applied to backing 37 as before and sintered at 350° C. However, no Nafion solution is applied to this sintered layer 38. Depending upon the necessity of waterproofing, additional material, such as TEFLON, may be added to the sintered layer 38.

Thereafter, the remaining amount, i.e. the other half of the catalyst, is applied with no sintering, i.e., the free-catalyst layer 39. The second free-catalyst layer 39 is applied as a layer over the sintered layer 38, and contains Nafion, water and catalyst, with no Teflon. Application of this layer can be performed in any number of ways, for example by painting using a camel hair brush as described herein, or alternatively by spraying. After the second layer is applied to the cathode, the membrane 40 and electrode 41 are hot pressed. In this way, the sintered layer 38 serves as a physical block to migration of the unsintered free-catalyst layer 39 during hot pressing. Thus, this new cathode comprises four layers, i.e. a backing layer 37, a sintered catalyst layer 38, a non-sintered catalyst layer 39 and a Nafion layer 40.

This multi-layer catalyst concept represents an improvement over the single sintered layer described above. The high temperature to which the sintered layer 38 is exposed can reduce the activity of the catalyst. By placing an unsintered layer 39 over the sintered layer 38, highly active catalyst is in direct contact with the membrane 40 after hot pressing. Another advantage of this improved process relates to the "sintered" TEFLON. This material can further reduce catalyst activity by covering active catalyst sites. The unsintered layer 39 bonds to the membrane 40, the lower catalytic activity of the "sintered layer" is thus less important in this new cathode composition. For this reason, it may be possible to increase the TEFLON content of the sintered layer to further improve the barrier to migration.

Electrode Construction

The electrodes of the present invention are preferably formed using a base of carbon paper. The starting material point is TGPH-090 carbon paper available from Toray, 500 Third Avenue, New York, N.Y. This paper may be pre-processed to improve its characteristics. The pre-processing uses a DuPont "Teflon 30" suspension of about 60% solids.

The paper can alternately be chopped carbon fibers mixed with a binder. The fibers are rolled and then the binder is burned off to form a final material which is approximately 75% porous. Alternately, a carbon paper cloth could be used. This will be processed according to the techniques described herein to form a gas diffusion/current collector backing.

A pre-processed carbon paper includes paper within which has been embedded TEFLON particles. The spaces between the TEFLON particles should preferably be small enough to prevent methanol or air from passing therethrough. Even better characteristics are used when other methanol derivatives, such as TMM are used.

The anode assembly is formed on a carbon paper base. This carbon paper is teflonized, meaning that TEFLON is added to improve its properties. The inventors have found that there is an important tradeoff between the amount of TEFLON which is added to the paper and its final characteristics. It is important to maintain a proper balance of the amount of TEFLON used, as described herein.

The paper is teflonized to make it water repellent, and to keep the platinum ink mix from seeping through the paper. The paper needs to be wettable, but not porous. This delicate balance is followed by dipping and heating the paper. The inventors found a tradeoff between the degree of wettability of the paper and the amount of impregnation into the paper, which is described herein.

First, the Teflon 30 emulsion must be diluted. One gram of Teflon 30 is added to each 17.1 grams of water. One gram of Teflon 30 of weight 60% corresponds to 60 grams of TEFLON per 100 ml. This material is poured into a suitable container such as a glass dish. The carbon paper is held in the material until soaked.

The soaking operation corresponds to weighing a piece of carbon paper, then dipping it into the solution for about 10 seconds or until it is obviously wet. The carbon paper is removed from the solution with tweezers, making as little contact with the paper as possible. However, the characteristics of TEFLON are such that the tweezers themselves will attract the TEFLON, and cause an uneven distribution of fluid. Teflon-coated tweezers are used to minimize this possibility. The carbon paper is held with a corner pointing down, to allow excess solution to drain off.

Figure 3:
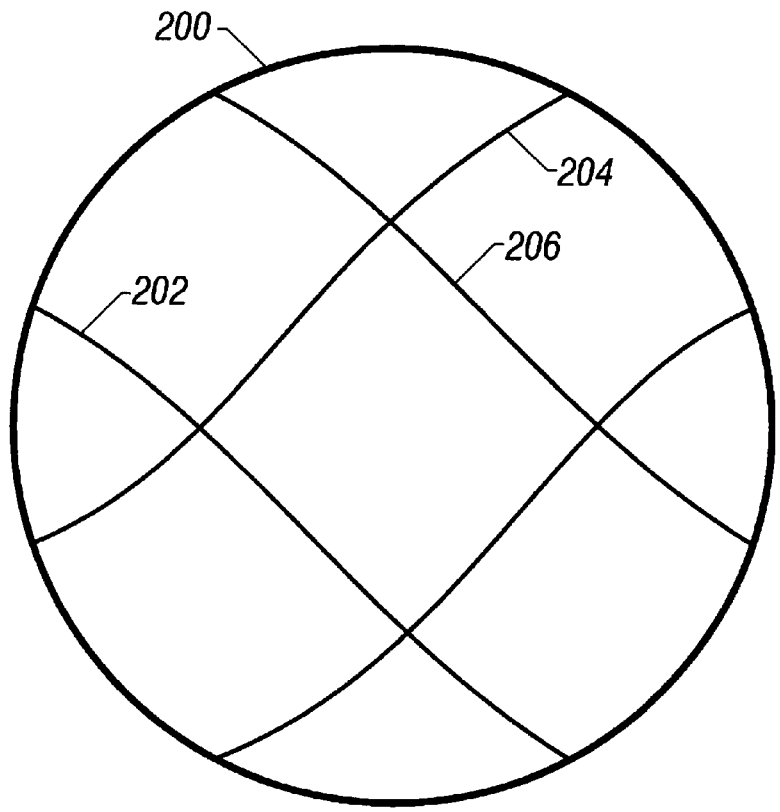
FIG. 3 shows the Teflon drying apparatus of the invention.

Teflon emulsion's surface tension characteristics are such that if the material were laid on a glass surface, a lot of the TEFLON would be dragged out by surface tension. Instead, a paper-drying assembly is formed as shown in FIG. 3. A plurality of TEFLON-covered wires 202 are stretched over a catchbasin such as a dish 200. The stretched wires form two sets of orthogonally-extending supports 202 and 204. The carbon paper which has just been treated with TEFLON solution is held across these supports.

Ideally, the wires are TEFLON-coated wires having a diameter of 0.43 inches. While these dimensions are not critical, a smaller amount of contact with the paper makes the suspension distribution on the wire more even. Kinks 206 are formed in the wires to prevent the carbon paper from touching the wires all along its length and hence further minimize the area of contact.

The paper-drying assembly shown in FIG. 3 is then placed into an oven at 70° C. for one hour. The treated carbon papers are removed from the dish after drying, and placed into glass containers. These are then sintered in a furnace oven at 360° C. for one hour. A properly processed paper will have its weight increased by 5% over the course of this process. More generally, any weight increase between 3 and 20% is acceptable. The paper is weighed to determine if enough absorption has occurred and/or if further paper processing will be necessary.

Alternatively, the carbon paper is not pre-processed with TEFLON. In either event, i.e. processed or unprocessed, the carbon paper is then used as a substrate for addition of the catalyst. Thus, the carbon paper plus one or more catalyst layers form the eventual electrode.

Two preferred techniques of application of the first catalyst-including layer are described herein: a direct application and a sputtering application. Both can use the special carbon paper material whose formation was described above, or other carbon paper including carbon paper which is used without any special processing. The direct application technique of the present invention mixes materials with the platinum-ruthenium material or platinum material described above or any other formulation, more generally, catalyst materials. The catalyst materials may be processed with additional materials which improve the characteristics.

For preparation of the anode, a platinum-ruthenium powder is mixed with an ionomer and with a water repelling material. The preferred materials include a solution of TEFLON micro-particles. 5grams of platinum-ruthenium powder are added in solvent. A DuPont T-30 mix of 60% TEFLON solid by weight appropriately diluted is added. These TEFLON micro-particles are then mixed. Preferably, a dilute Teflon 30 suspension of 12 weight percent solids including 1 gram of Teflon 30 concentrate to 4 grams of de-ionized water is made. 300 mg of de-ionized water is added to 350 mg of the 12 weight percent TEFLON solution described above. 144 mg of platinum-ruthenium is mixed to this solution. The resultant mixture is then mixed using an ultrasonic mixing technique—known in the art as "sonicate". The ultrasonic mixing is preferably done in an ultrasonic bath filled with water to a depth of about ¼ inch. The mixture is "ultrasonicated" for about 4 minutes.

Alternatively, the anode may also include a Nafion material. In this instance it is important that the Teflon must first be mixed with the platinum-ruthenium as described above to form about 15% by weight TEFLON. Only after this mixture is made can the Nafion be added. The inventors have found that if Nafion is added first, it may surround the particles of platinum and ruthenium. Therefore, the order of this operation is critically important. At this point, 0.72 grams of 5 weight percent Nafion is added to the jar, which is sonicated again for 4 minutes. More generally, approximately 1 mg of Nafion needs to be added per square cm of electrode to be covered. The amount of TEFLON described above may also be modified, e.g. by adding only 652 ml of the solution.

This process forms a slurry of black material. This slurry of black material is then applied to the carbon paper. The application can take any one of a number of forms. The simplest form is to paint the material on the carbon paper backing, using alternating strokes in different directions. A small camel hair brush is used to paint this on. The preferred material amounts described above form enough catalyst for one side of a 2-inch by 2-inch piece of 5 weight percent teflonized carbon paper. Accordingly, the painting is continued until all the catalyst is used.

A drying time of two to five minutes between coats should be allowed, so that the material is semi-dryed between coats and each coat should be applied in a different direction. The anode then needs to dry for about 30 minutes. After that 30 minutes, the anode must be "pressed" immediately. The pressing operation is described herein.

The resulting structure is a porous carbon substrate used for diffusing gases and liquids, covered by 4 mg per square cm of catalyst material.

An alternative technique of applying the materials sputters the materials onto the backing.

Cathode Construction

The cathode electrode carries out a reaction of $O_2+H^++e^- \rightarrow$ water. The $O_2$ is received from the ambient gas around the platinum electrode, while the electron and protons are received through the membrane or the circuit load. The cathode is constructed by first preparing a cathode catalyst ink. The cathode catalyst ink is preferably pure platinum, although other inks can be used and other materials can be mixed into the ink as described herein. An amount equal to about 250 mg of platinum is used for the cathode assembly. This is divided between the sintered catalyst layer and unsintered catalyst layer as described more fully below. For the sintered layer about 125 mg of platinum catalyst is mixed with about 0.25 gram of water, if TEFLON is to be included preferably 18.6 mg of TEFLON is added, although this can range from about 1 mg to about 40 mg. The relative ratios of platinum to water to TEFLON will vary depending upon the requirements of the fuel cell and cathode assembly. These ratio are easily determined by those skilled in the art. The mix is sonicated for five minutes. No Nafion is added to this layer. This forms enough material to cover one piece of 2×2" carbon paper. Unprocessed Toray carbon paper can be used with no TEFLON therein. However, preferably the material is teflonized as discussed above. The procedures are followed to make a 5% TEFLON impregnated paper. Catalyst ink is then applied to the paper as described above to cover the material with 2 mg/cm$^2$/g of Pt. Teflon content of the paper can vary from 3–20%, 5% being the preferred. The paper is then heated at 300° C. for one hour to sinter the catalyst and TEFLON particles.

The carbon-catalyst sintered paper is then used as the substrate for the addition of the free-catalyst layer. By "free-catalyst" or "unsintered catalyst" is meant a layer comprising catalyst, such as platinum, that is highly active, having open catalyst sites and which is in direct contact with the polymer proton-conducting membrane after hot pressing. The free-catalyst layer or unsintered catalyst layer is prepared by mixing the remaining amount of platinum, i.e. the unused portion of catalyst remaining after preparing the sintered layer, with water and preferably a 5% Nafion solution. For example, 125 mg of platinum is mixed with 0.25 gram of water. The mix is sonicated for five minutes and combined with a 5% solution of Nafion. The mix is again sonicated for five minutes to obtain a uniform dispersal. This second free-catalyst layer is applied to the carbon-catalyst sintered paper. Application can be performed by any number of means including painting, spraying, and methods known to those skilled in the art. The free-catalyst layer is allowed to dry whereupon it is hot pressed to the proton-conducting membrane as described more fully below.

Using this technique, cell performance was improved from 212 mv at 300 ma/cm$^2$ in the single catalyst layer cathode to 387 mv at 300 ma/cm$^2$ in the present invention, i.e. the two layer catalyst cathode.

Sputtering

An alternative technique of cathode forming utilizes a sputtered platinum electrode. This sputtered platinum electrode has been found to have significant advantages when used as a plain air electrode. The process of forming the sputtered platinum electrode is described herein.

This alternative technique for forming the cathode electrode starts with fuel cell grade platinum. This can be bought from many sources including Johnson-Matthey. 20 to 30 gms per square meter of surface area of this platinum are applied to the electrode at a particle size of 0.1 to 1 micron.

A platinum source is a solid rod of material. According to this embodiment, the material is sputtered onto the substrate prepared as described above. The platinum powder is first mixed with aluminum powder. This mixing can be carried out using mechanical means for example, or it can be done using salt combination techniques for the formulation of the anode ink. The platinum-aluminum mixture is sputtered onto the carbon paper backing using any known sputtering technique from the semiconductor arts.

Figure 4:
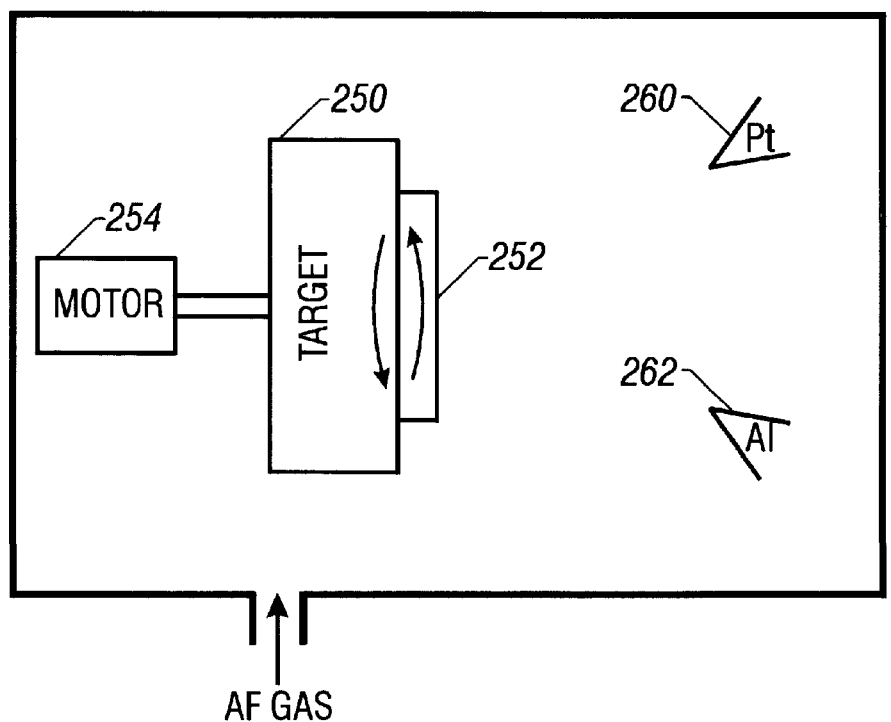
FIG. 4 shows the preferred sputtering technique of the present invention.

The platinum is sputtered as follows using the system diagramed in FIG. 4. A standard 4-inch target 250 holds the carbon paper electrode 252. The target is rotated by a motor 254 at one rotation per 10 seconds. The preferred technique used herein sputters platinum (Pt) from a first Pt source 260 and aluminum (Al) from an Al source 262. The platinum is sputtered at 0.23 amps and the aluminum at 0.15 amps at about 200 volts. The two sources impinge from different directions towards the targets at 45° angles.

The inventors found that 20 Torr was the ideal pressure for this sputtering, although any pressure between 1 torr and 50 torr could be used. The Argon pressure is about 30 torr. However, different argon pressures can be used to form different particle sizes. The sputtering is done for about 8 minutes.

Preferably, once sputtered, the etching is carried out by dipping the sputtered backing into an etching solution, followed by a washing solution followed by dipping.

The sputtered electrode is a mixture of Al and Pt particles on the backing. The electrode is washed with potassium hydroxide (KOH) to remove the aluminum particles. This forms a carbon paper backing with very porous platinum thereon. Each of the areas where the aluminum was formed is removed—leaving a pore space at that location. The inventors found that a thick coating of the Pt-Al material would prevent washing out the Al from some lower areas of the catalyst. The present invention uses a thin coating— preferably a 0.1 micron coating or less with a material density between 0.2 mg per cm$^2$ and 0.5 mg per cm$^2$. This sputtering technique is useful in the formation of the first layer, e.g. the sintered layer, of the cathode. Further processing to provide for the free-catalyst layer is performed using the methods described above.

At this point, we now have an anode, a membrane, and a cathode. These materials are assembled into a membrane electrode assembly ("MEA")

"Hot Pressing" and MEA Formation

The electrode and the membranes are first laid or stacked on a CP-grade 5 Mil, 12-inch by 12-inch titanium foil. Titanium foil is used by the present inventors to prevent any acid content from the membrane from leaching into the foil.

First, the anode electrode is laid on the foil. The proton conducting membrane has been stored wet to maintain its desired membrane properties. The proton conducting membrane is first mopped dry to remove the macro-sized particles. The membrane is then laid directly on the anode. The cathode laid on top of the membrane. Another titanium foil is placed over the cathode.

The edges of the two titanium foils are clipped together to hold the layers of materials in position. The titanium foil and the membrane between which the assembly is to be pressed includes two stainless steel plates which are each approximately 0.25 inches thick.

The membrane and the electrode in the clipped titanium foil assembly is carefully placed between the two stainless steel plates. The two plates are held between jaws of a press such as an arbor press or the like. The press should be maintained cold, e.g. at room temperature.

The press is then actuated to develop a pressure between 1000 and 1500 psi, with 1250 psi being an optimal pressure. The pressure is held for 10 minutes. After this 10 minutes of pressure, heating is commenced. The heat is slowly ramped up to about 146° C.; although anywhere in the range of 140–150° C. has been found to be effective. The slow ramping up should take place over 25–30 minutes, with the last 5 minutes of heating being a time of temperature stabilization. The temperature is allowed to stay at 146° C. for approximately 1 minute. At that time, the heat is switched off, but the pressure is maintained.

The press is then rapidly cooled using circulating water, while the pressure is maintained at 1250 psi. When the temperature reaches 45° C., approximately 15 minutes later, the pressure is released. The bonded membrane and electrodes are then removed and stored in de-ionized water.

Flow Field

A fuel cell works properly only if fuel has been properly delivered to the membrane to be reacted and/or catalyzed. The membrane electrode assembly of the present invention uses a flow field assembly as shown in FIG. 5. Each membrane electrode assembly ("MEA") 302 is sandwiched between a pair of flow-modifying plates 315 and 312 which include biplates and end plates. A flow of fuel is established in each space 303 between each biplate/endplate and MEA. The collection of biplates/endplates and MEA forms a "stack". The biplate includes provisions for fluid flow at both of its oppositely-facing surfaces. The end flowplate of the stack is an end plate 320 instead of a biplate. The endplate has chambers on one side only. The biplate 315 includes a plurality of separators 306 and a plurality of chamber forming areas 308. The separators 306 have the function of pressing against the membrane electrode assembly 302. The end surface of separators 306 are substantially flat surfaces that contact the surface of the MEA 302.

The biplates are formed of an electrically conductive material in order to couple all the membrane electrode assemblies 302, 310 in series with one another.

Membrane electrode assemblies 302, as described above include an anode, a membrane, and a cathode. The anode side 304 of each membrane electrode assembly is in contact with an aqueous methanol source in space 314. The cathode side 321 of each membrane electrode assembly is in contact with an oxidant air source which provides the gaseous material for the reactions discussed above. The air can be plain air or can be oxygen.

Flows of these raw materials are necessary to maintain proper supply of fuel to the electrode. It is also desirable to maintain the evenness of the flow.

The membrane electrode assembly is pressed by a porous portion of the biplate. This porous portion allows at least some of the fuel to reach that portion of the electrode. This can improve the electrical operation of the MEA. This feature of the present invention also provides other bonded pieces which prevent the fluid from passing over into the other portions of the electrode membrane assembly.

The present invention operates using methanol sensors. A particularly preferred methanol sensor uses MEA technology described above. As described above, a fuel cell is formed of an anode and a cathode. The anode receives methanol. The cathode receives air or oxygen.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A fuel cell electrode comprising:
a backing material having a sintered layer thereon, and a non-sintered free-catalyst layer.

2. The fuel cell electrode of claim 1, wherein the backing material is carbon paper.

3. The fuel cell electrode of claim 1, wherein the sintered layer comprises a catalyst.

4. The fuel cell electrode of claim 3, further comprising a sintered layer having a waterproofing amount of polytetrafluoroethylene.

5. The fuel cell electrode of claim 1, wherein the non-sintered free-catalyst layer comprises, catalyst and a copolymer of tetrafluoroethylene and perfluorovinylether sulfonic acid.

6. A method of forming a fuel cell electrode, comprising:
obtaining a backing material;
sintering the backing material with a catalyst material; and
applying a free-catalyst layer to the electrode.

7. The method of claim 6, wherein the backing material is carbon paper.

8. The method of claim 6, wherein the catalyst material comprises a catalyst and a waterproofing amount of Teflon.

9. The method of claim 6, wherein the free-catalyst layer comprises catalyst and a copolymer of tetrafluoroethylene and perfluorovinylether sulfonic acid.

10. The method of claim 6, further comprising hot-pressing the electrode to a membrane.

11. A fuel cell element of a type intended for an electrochemical reaction, comprising: a backing, a catalyst material sintered to the backing and a free catalyst layer.

12. The fuel cell element of claim 11, wherein the catalyst material has characteristics that are similar to platinum.

13. A fuel cell comprising:
an anode and a cathode chamber;
a proton conducting membrane separating the anode and cathode chambers; and
at least anode and cathode electrodes, wherein the electrodes include a backing material, a sintered catalyst layer and a free catalyst layer, in electrical communication with the proton conducting membrane.

14. The fuel cell of claim 13, wherein the backing material is carbon paper.

15. The fuel cell of claim 13, further comprising a sintered catalyst layer having a waterproofing amount of polytetrafluoroethylene.

16. The fuel cell of claim 13, wherein the free-catalyst layer comprises catalyst and a copolymer of tetrafluoroethylene and perfluorovinylether sulfonic acid.

17. A membrane electrode assembly, comprising:
an anode electrode including a backing material and at least one catalyst layer thereon;
a proton conducting solid electrolyte member; and
a cathode electrode including a backing material having a sintered layer thereon, and a non-sintered free-catalyst layer; wherein the anode, cathode and electrolyte member are press bonded to one another in that order so that said electrolyte member is between said anode and cathode electrodes.

18. The membrane electrode assembly of claim 17, wherein the backing material is carbon paper.

19. The membrane electrode assembly of claim 17, further comprising a sintered layer having a waterproofing amount of polytetrafluoroethylene.

20. The membrane electrode assembly of claim 17, wherein the non-sintered free catalyst layer comprises catalyst and a copolymer of tetrafluoroethylene and perfluorovinylether sulfonic acid.

* * * * *